United States Patent [19]

Beck

[11] 3,765,081

[45] Oct. 16, 1973

[54] METHOD OF FORMING KEEPERED WORD LINE PLATED WIRE MEMORY ARRAY

[75] Inventor: Ronald A. Beck, Bloomington, Minn.

[73] Assignee: Sperry Rand Corporation, New York, N.Y.

[22] Filed: Sept. 25, 1970

[21] Appl. No.: 75,389

[52] U.S. Cl. .............. 29/604, 29/625, 340/174 PW, 340/174 S, 340/174 BC

[51] Int. Cl. .............. H01f 7/66

[58] Field of Search .............. 29/604, 625; 340/174 BC, 174 PW, 174 S

[56] References Cited

UNITED STATES PATENTS 3,604,109 9/1971 Crimmons .............. 29/604

3,513,538 5/1970 Bryzinski .............. 29/604

3,553,648 1/1971 Gorman et al. .............. 340/174 PW 3,448,514 6/1969 Reid et al. .............. 29/604

*Primary Examiner*—Richard J. Herbst

*Assistant Examiner*—Carl E. Hall

*Attorney*—Kenneth T. Grace, Thomas J. Nikolai, and John P. Dority

[57] ABSTRACT

A method of forming a plated wire memory array comprising fabricating a laminate including adhesively bonded sheets of keeper and copper, forming word lines in the copper sheet, filling the interstitial areas between adjacent word lines with a particulate keeper material, bonding the word lines to a tunnel structure and then inserting plated wire bit lines in the tunnels.

1 Claim, 5 Drawing Figures

INVENTOR
RONALD A. BECK
BY Kenneth T. Grace
ATTORNEY

INVENTOR
RONALD A. BECK
BY
ATTORNEY

METHOD OF FORMING KEEPERED WORD LINE PLATED WIRE MEMORY ARRAY

BACKGROUND OF THE INVENTION

The present invention relates generally to magnetic memory arrays and in particular to plated wire memory arrays in which a plurality of plated wire bit-sense line memory elements are constrained by an equal plurality of parallelly arranged tunnels which plated wires are inductively coupled to a plurality of orthogonally oriented word lines. A typical prior art plated wire memory array is that of the patent application of L. J. Michaud, et al., now U.S. Pat. No. 3,538,599. These prior art plated wire memory arrays are primarily directed toward arrangements providing economical yet operationally efficient packaging of plated wire bit-sense lines and the inductively coupled word lines. The present invention is considered to be an improvement upon such prior art plated wire memory arrays.

SUMMARY OF THE INVENTION

The present invention is directed toward a plated wire memory array in which the word lines do not envelop the plated wire memory elements but are arranged on only one side thereof. The word lines are arranged in a single word line plane, being etched from a copper sheet, with a particulate keeper material added to the interstitial areas between adjacent word lines. A keeper sheet is parallelly superposed the word line, particulate keeper plane. A tunnel structure is then insulatively bonded to the word lines such that the word line, particulate keeper plane is sandwiched between the keeper sheet and the tunnel structure. The tunnel structure aligns the plated wire memory elements parallel to each other and perpendicular to the word lines, and provides an electrical ground plane for the plated wire memory element flux field. The word lines are in a close inductive coupling relationship with the plated wire memory elements due to their proximity and the high permeability path provided the word line generated flux by the keeper sheet and the particulate keeper. This arrangement eliminates the need for the second word line plane priorly used to envelop the plated wire memory elements and the concommitent problems associated with superposed word line misalignment.

DESCRIPTION OF THE PREFERRED EMBODIMENT

Figure 1:
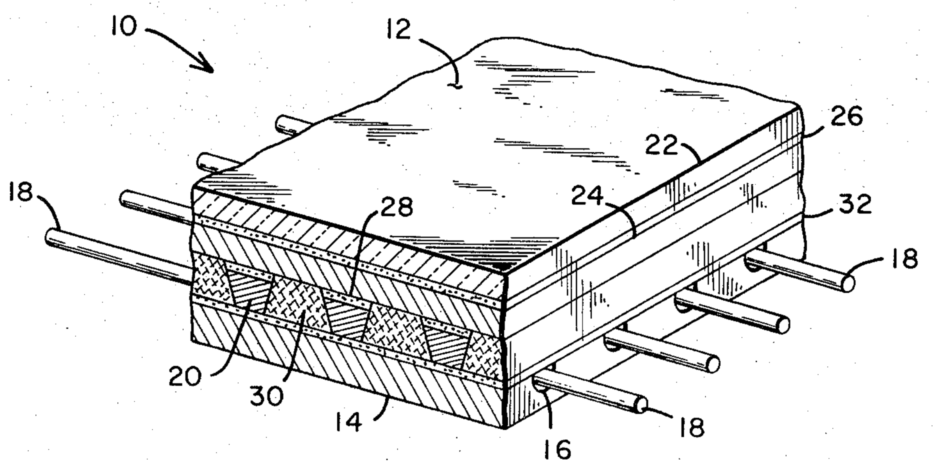
FIG. 1 is a trimetric view of a preferred embodiment of a plated wire memory array fabricated in accordance with the present invention.

With particular reference to FIG. 1, there is presented a trimetric view of a preferred embodiment of a plated wire memory array incorporating the present invention. Array 10 is comprised of word line plane 12 and tunnel plane 14 bonded together along their contiguous, mating surfaces forming a plurality of tunnels 16 into which a plurality of plated wire memory elements 18 are inserted and loosely constrained and which plated wire memory elements 18 are inductively coupled to and orthogonally oriented with respect to the plurality of word lines 20. Word line plane 12 is preferably comprised of a substrate 22, a keeper sheet 24 and a copper sheet 21 from which a plurality of word lines 20 are formed thereon by well known methods. Such three layers are formed into an integral word line plane 12 by two di-electric adhesive layers 26 and 28. Substrate 22 is preferably formed of an epoxy glass layer 0.06 inch thick. The copper layer 21 from which word lines 20 are formed is preferably 1 ounce (0.0014 inch thick) copper sheet, both affixed to a Conetic keeper sheet 24 of 0.005 inch thickness, (or one which is preferably formed of 200–300 mesh Conetic particles suspended in an epoxy vehicle) by suitable dielectric adhesive layers 26, 28. Tunnel plane 14 is preferably a copper ground plane 0.01 inch thick with channels 16 etched or milled therein (and then subsequently insulated) for the loose constriction of plated wire memory elements 18 of 0.0025 DIA. Word line plane 12 and tunnel plane 14 are then bonded together by a dry film adhesive 32 of 0.0025 inch thickness to form the integral array 10. The so-formed array 10 maintains the desired inductive relationship between the plated wire memory elements 18 and the orthogonally oriented word lines 20.

Figure 2:
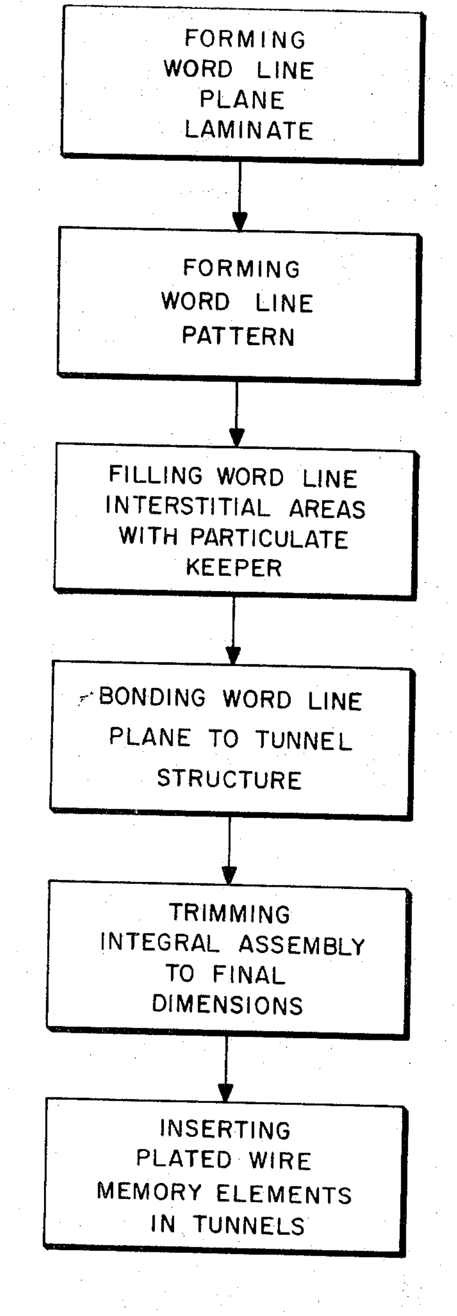
FIG. 2 is a flow diagram illustrating a typical series of steps that may be followed in preparing a plated wire memory array in accordance with the preferred technique of the present invention.
Figure 3:
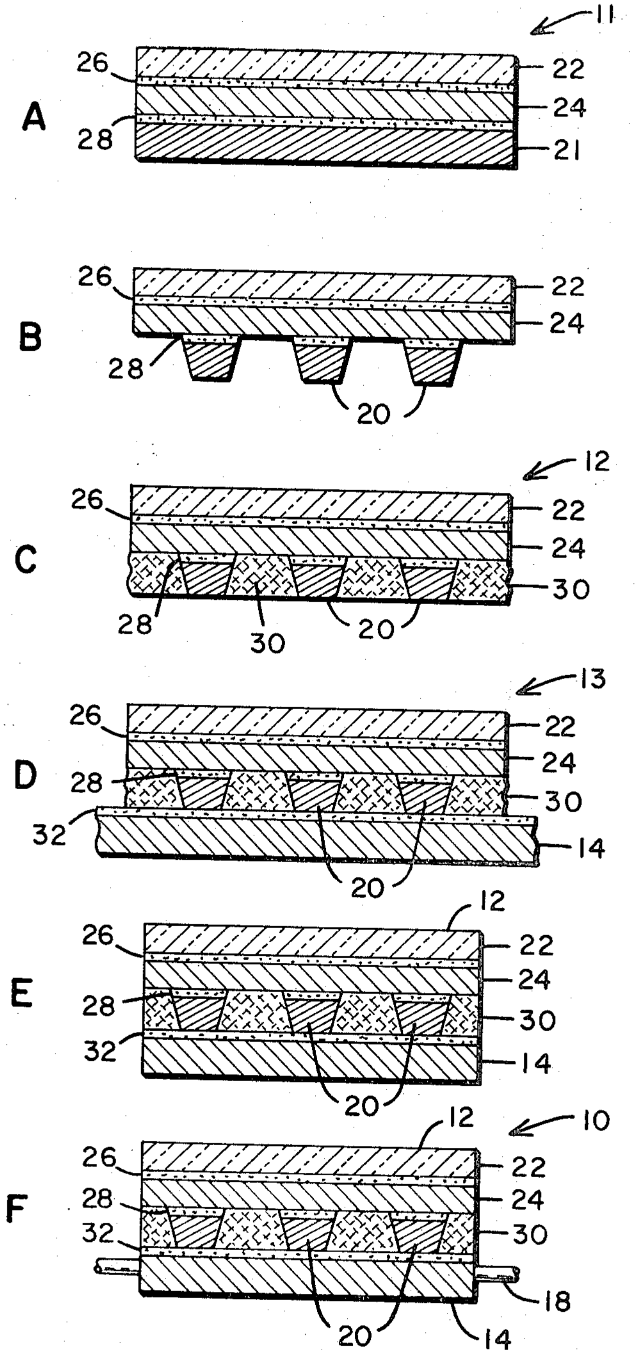
FIG. 3 is a series of views illustrating a typical production plated wire memory array that is under preparation in accordance with the techniques of FIG. 2, the various figures illustrating the apparatus progressively at various stages of its production and corresponding to the steps that are indicated adjacently in the flow diagram of FIG. 2.

Discussion of an exemplary method of fabrication of the plated wire memory array 10 of FIG. 1 as proposed by the present invention shall proceed with reference to FIGS. 2 and 3. FIG. 2 illustrates a flow diagram of a series of steps which may be followed in preparing the array 10 in accordance with the preferred technique of the present invention. FIG. 3 illustrates progressively the appearance of the product of the present invention during various stages of its fabrication. Each of the illustrations of FIG. 3 are located adjacent the step during which it is formed, as seen in the flow charg in FIG. 2.

As indicated by the flow chart of FIG. 2, a preferred method of practicing the illustrated method of the present invention commences in Step A with the fabrication of the laminate 11 of word line plane 12. Laminate 11 is, as discussed above, a rigid assembly of substrate 22, sheet keeper 24 and copper layer 21 (from which word lines 20 are formed by well-known methods); are all formed into an integral assembly by dielectric adhesive layers 26, 28. Substrate 22 is relied upon to provide the structural rigidity to word line plane 12 and preferably consists of an epoxy glass layer 0.06 inch thick. The material preferred for the fabrication of substrate 22 is FR–4 grade epoxy glass, Fortin Laminating Co., North Hollywood, California; however, any suitably rigid material such as glass or metal may be utilized. Keeper sheet 24 is preferably a Conetic sheet 0.005 inch thick such as Hypernom, Westinghouse Corp.; however, any material providing the desirably high permeability and low retentivity may be utilized. Substrate 22, keeper sheet 24 and the copper sheet 21, from which word lines 20 are formed, are assembled into an integral assembly of laminate 11 by the sandwiching of adhesive dielectric layers 26, 28 therebetween and insertion in a suitable heated machine press. Laminate 11 is then cured in the machine press for one hour at 350° F. at 500 lbs. per square inch (PSI). Layers 26, 28 may be from 0.0005 to 0.0025 inch thick and e.g.; thermal plastic such as GT–100, dry film adhesive Schjeldahl Co., Northfield, Minn.; or thermosetting such as White-Flex sheet film, Fortin Laminating Co., North Hollywood, California.

After fabrication of laminate 11 in Step A, Step B of the present method is initiated. Step B consists of forming, or fabricating, the desired word line 20 printed circuit patterns in copper sheet 21. The patterns may be formed in copper sheet 21 in accordance with methods well-known in the printed circuit art today such as that of the J. Y. Huie, et al., U.S. Pat. No. 3,626,586. In applicant's illustrated preferred embodiment, word lines 20 are straight, parallel strips 0.010 inch wide on 0.020 inch center-to-center spacing.

After forming the plurality of word lines 20 in copper sheet 21 in Step B, Step C of the present method is initiated. Step C involves filling the interstitial areas between adjacent word lines 20 with a particulate keeper material 30. Keeper material 30 is, in applicant's illustrated preferred embodiment, formulated of 200–300 mesh Conetic particles e.g.; Ferramic H, Indiana General Corp, Keasbey, New Jersey, in a suitable vehicle at a volume ratio of 6 to 1. The vehicle; for a rigid formulation after curing may be No. 7004, H. B. Fuller Co., St. Paul, Minnesota; or for a nonrigid formulation after curing may be RTV–102, General Electric Co., Waterford, N.Y.

After filling and curing the particulate keeper material 30 in the interstitial areas between word lines 20 in Step C, Step D of the present method is initiated. Step D involves bonding word line plane 12 to a tunnel plane 14 by means of a dielectric adhesive layer 32. In the present method, layer 32 may be initially affixed to the exposed bottom surfaces of word lines 20 or to the exposed surfaces, interstitial the channels 16 in the top surface, of tunnel plane 14 with the channels 16 oriented orthogonal to the longitudinal axes of word lines 20. The assemblage of word line plane 12, tunnel plane 14 and layer 32 is then inserted in a suitable machine press and is cured for one hour at 350°F. at 100 PSI. Tunnel plane 14, in the illustrated preferred embodiment, is a copper or aluminum sheet of 0.10 inch thick with a plurality of channels 16 0.004 inch wide and 0.004 inch deep on 0.010 inch center-to-center spacing, etched in the top surface thereof. An electrical insulative coating is applied to the channel 18 areas and/or to the plated wire memory elements 16 to provide electrical insulation therebetween.

After forming integral assembly 13 in Step D, Step E of the present method is initiated. Step E involves trimming the so-formed integral structure 13 formed in Step D above to the desired size, e.g.; outside dimensions. Such trimming may be accomplished by any of many methods such as cutting, shearing or punching.

After trimming integral structure 13 to the desired size in Step E, Step F of the present method is initiated. Step F involves inserting the plurality of plated wire memory elements 18 in the channels 16 of tunnel plane 14. This step may involve the hand insertion of the plated wire memory elements 18.

Figure 4:
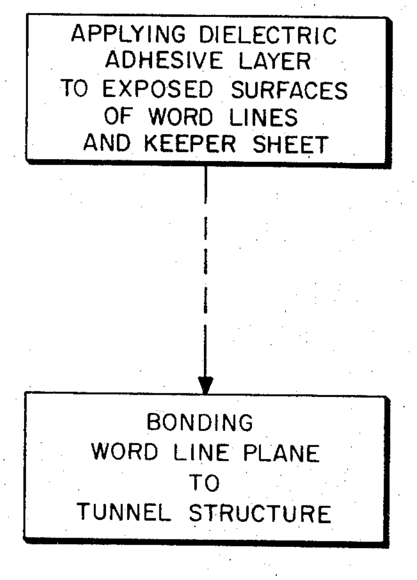
FIG. 4 is flow diagram illustrating a typical series of steps that may be followed in preparing a plated wire memory array in accordance with an alternative preferred technique of the present invention.
Figure 5:
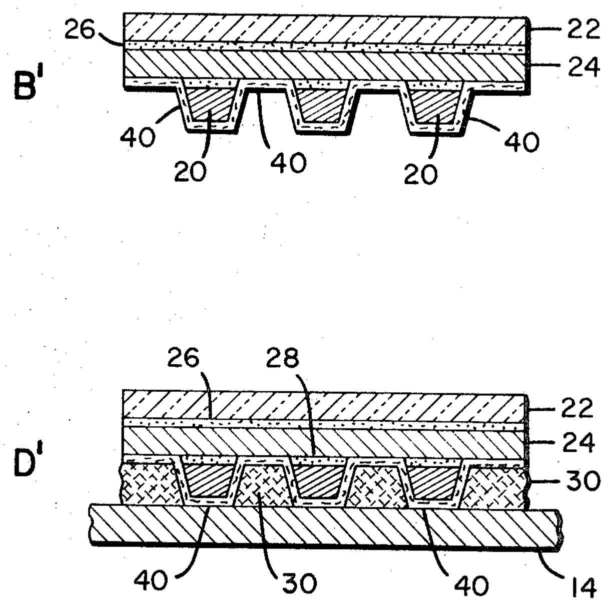
FIG. 5 is a series of views illustrating a typical production plated wire memory array that is under preparation in accordance with the techniques of FIG. 4, the various figures illustrating the apparatus progressively at various stages of its production and corresponding to the steps that are indicated adjacently in the flow diagram of FIG. 4.

As an alternate method of forming array 10, a Step B, intermediate Steps B and C of FIGS. 2, 3, could be employed when a dielectric adhesive layer 40 is applied by spraying, painting, etc. to the bottom exposed surfaces of word lines 20 and keeper 24; see FIGS. 4,5. This Step $B^1$ of FIGS. 4,5 would require the replacing of Step D of FIGS. 2, 3 by Step $D^1$ of FIGS. 4,5 whereby the dielectric adhesive layer 40 on the bottom exposed surfaces of word lines 20 would replace and perform the same function as the dielectric adhesive layer 32 of Step D.

I claim:

1. A method of forming a keepered word line, plated-wire memory array, comprising:

a. forming a laminate by adhesively bonding a keeper sheet between a substrate member and a copper sheet;

b. forming in said copper sheet a pattern of adjacent word lines having interstitial areas therebetween;

c. applying a dielectric adhesive layer to the exposed surfaces of said word lines and of said keeper sheet that are interstitial said word lines;

d. filling the interstitial areas between adjacent ones of said word lines with a particulate keeper material;

e. forming a tunnel plane by forming a plurality of channels in a sheet member;

f. forming an integral assembly of said laminate and said tunnel plane by bonding the bottom surfaces of said word lines to the surfaces of said tunnel plane that are interstitial said channels; and, g. inserting plated-wire memory elements in tunnels formed by said channels.

* * * * *